Oct. 16, 1962 D. HAFLER 3,059,190

PRE-AMPLIFIER

Filed Aug. 18, 1958 2 Sheets-Sheet 1

INVENTOR

DAVID HAFLER

BY Hurwitz & Rose

ATTORNEYS

INVENTOR
DAVID HAFLER
BY Hurvitz & Rose
ATTORNEYS

United States Patent Office
3,059,190
Patented Oct. 16, 1962

3,059,190
PRE-AMPLIFIER
David Hafler, 617 N. 41st St., Philadelphia, Pa.
Filed Aug. 18, 1958, Ser. No. 755,685
9 Claims. (Cl. 330—92)

This invention relates generally to amplifiers, and has particular relation to audio pre-amplifiers for connection between a signal source, such as a phonograph or radio tuner, and a power amplifier. In its specific aspects this invention concerns itself with high fidelity reproducing and it is an object of this invention to provide a pre-amplifier having properties suitable for high fidelity work.

More specifically, it is an object of this invention to provide an amplifier for amplifying voice or music signals or any other sounds or noises in the audio frequency range, between sub-audible and super-audible or supersonic frequencies, without distortion and with true fidelity, and it is a specific object of this invention to provide such an amplifier including novel tone control devices which contribute to the stability and fidelity of the amplifier, and have particularly low intermodulation distortion.

It is then an object of this invention to provide an amplifier particularly suitable for high fidelity amplification which shall have particularly low distortion over the operating frequency range.

A specific object of this invention is to provide a novel tone-control circuit for a high fidelity audio amplifier.

An ancillary object of this invention is to provide a novel amplifier unit.

In accordance with the present invention, a pre-amplifier is provided in which there is included at least two cascaded stages, i.e., an input and an output stage, with negative feedback circuits for tonal correction and for other purposes connected between the output circuit of the output stage and the cathode of the input stage. Since the stages have negative feedback, the overall distortion is reduced, the frequency range is extended, and the output impedance is lowered.

Specifically, a pre-amplifier according to this invention embodies a new circuit in which both voltage and current feedback loops include every tube section. These feedback loops yield high stability and consistency of performance, greatly reduced distortion, and exceptionally low noise. This new circuit includes a plurality of amplifier units or feedback pairs, each unit or pair including two cascaded stages of amplification. Each unit includes negative feedback connections dependent both on the output voltage of the unit and on the current conducted by one or both of the stages.

In accordance with the specific aspects of this invention, there are two such units or pairs; a low level amplifier and a tone-control unit.

A double triode connected as a feedback pair with equalization determined by feedback at frequency extremes serves as a low level amplifier. This amplifier may serve to amplify the outputs of a magnetic cartridge, microphone, or tape head. Preferably this low level amplifier may have a voltage gain of 50 to bring up low level sources to a point comparable to inputs from high level sources such as radio tuners, tape recorders, etc. A second double triode, connected as a similar feedback pair, is the tone control unit; and tone control action is adjusted by control of feedback at frequency extremes. This unit may have a voltage gain of 10, bringing the various inputs up to a high enough level to energize any available power amplifier.

A volume control and switching system interconnects the two feedback pairs. By this arrangement, signals are attenuated before going into the tone control unit so that there is no possibility of overloading regardless of the amplitude of the signal source. Therefore, distortion is unaffected by the position of the volume control. In many prior art pre-amplifiers distortion is lowest with the volume wide open, but rises significantly with the volume in the normal listening positions. This does not occur in pre-amplifiers arranged according to the present invention.

The present invention also eliminates frequency discrimination for different positions of the volume control. In some prior art apparatus high frequency response is lost when volume is reduced. This does not occur in the present pre-amplifier, wherein nothing is changed except the total gain, in adjusting the gain of the pre-amplifier.

Pre-amplifiers, according to the present invention, are conceived as complete control units, so that there is no need to have the power amplifier in an accessible location. All switching of the audio circuits as well as control of the A.C. power to the auxiliary equipment is controlled from the pre-amplifier. A built-in rectifier supply, which converts the filament alternating current to D.C., permits extremely quiet operation regardless of the power source to which the pre-amplifier is connected.

The novel features considered characteristic of this invention are disclosed generally above. The invention itself both as to its organization and as to its method of operation, together with additional objects and advantages thereof, will be understood from the following description of a specific embodiment when read in connection with the accompanying drawings, in which.

Figure 1:
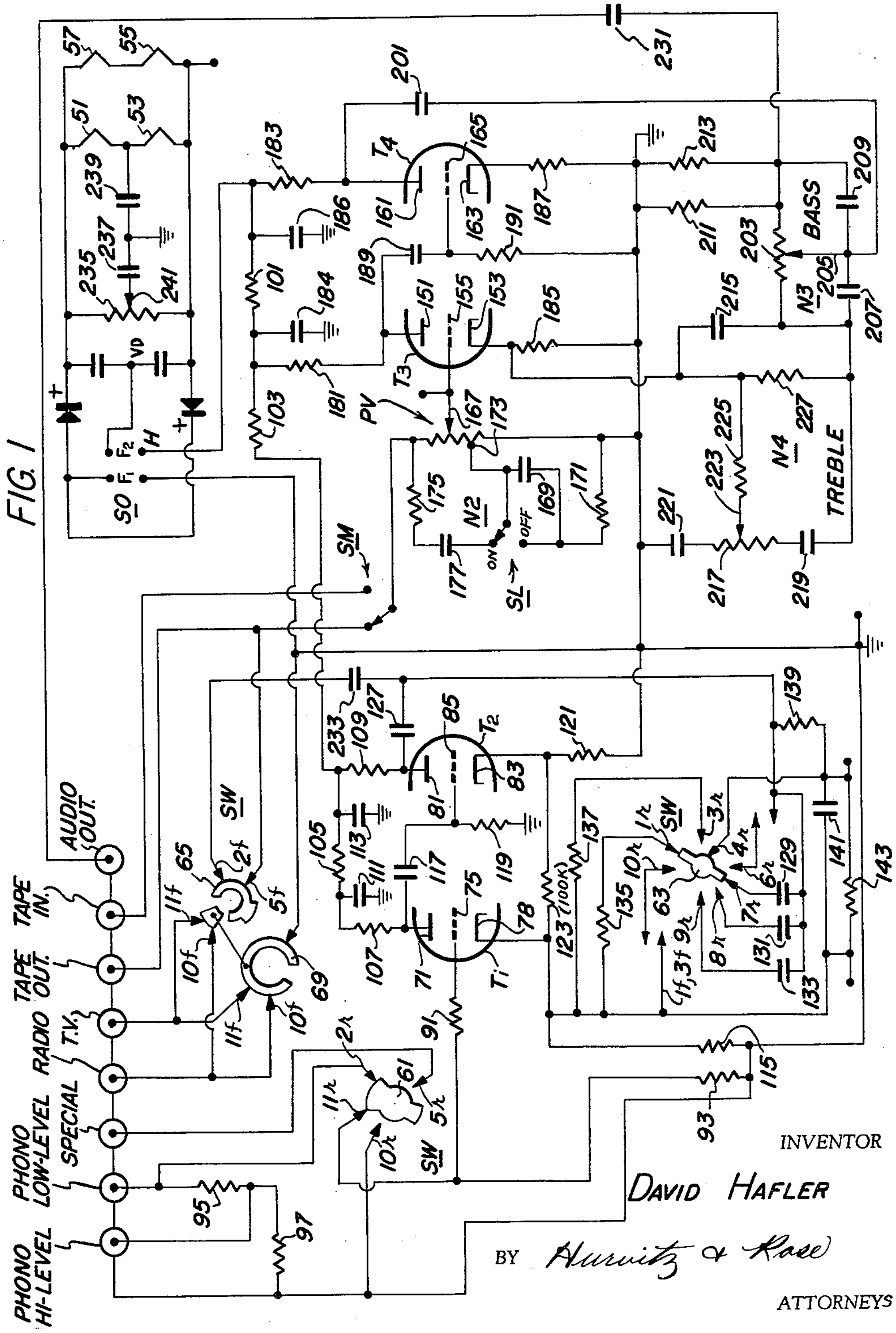
FIGURE 1 is a circuit diagram of a preferred embodiment of the invention.

The pre-amplifier, according to this invention, includes an Input Unit, a Low-Level Amplifier, a Tone Control Unit and a Power Supply Unit. This apparatus may be housed in a metal cabinet (not shown) having a front panel through which the operating knobs and handles of the apparatus extend. The rear of this cabinet includes the various input and output connections or plugs. The power cables may also be brought into the rear of the cabinet. The larger components, such as decoupling capacitors, may be mounted from the walls or base of a chassis (not shown) enclosed in the cabinet. The smaller components and the tubes are mounted on a printed circuit board suspended from the chassis.

The Input Unit includes a plurality of plugs for selecting the signals which are to be impressed on the input of the pre-amplifier. The labelling on the plugs indicates the signal which may be impressed through each plug. Thus, the output of a General Electric or Fairchild magnetic phonograph pick-up (having less than 15 millivolts output) may be impressed on the Phono Lo-Level. Pick-ups like Pickering or Miratwin (having greater than 15 millivolts output) may be impressed on the Phono Hi-Level. The Hi-Level plug is connected as part of the Lo-Level plug and serves to attenuate stronger signals. Radio tuners may be connected to the Radio plug, tape recorders through the Tape-In plug, and such high level signal sources as crystal pick-ups or television sound to the TV plugs. The Special plug may serve as an auxiliary magnetic phonograph input, for example, for a record changer, for a tape head or for microphone input.

The Input Unit has two output plugs: Tape Out feeding a tape recorder from the Low Level Amplifier and Audio Out for feeding the power amplifier. The former permits the tape recorder to be fed with a signal uninfluenced by the volume control PV or tone controls N3 and N4. For example, a signal from Radio may be recorded while it is being reproduced for monitor purposes through the Tone Control Unit.

The Low Level Amplifier includes a selector switch SW. For convenience in explanation four different parts of the switch are shown in four different positions of the diagram. The switch has a forward deck and a rear deck and twelve lugs on each deck adapted to be interconnected by manually movable arms 61, 63, 65, 67 which are movable together. The forward deck lugs are labelled 1f through 12f and the rear deck lugs 11r through 12r. There are pairs of lugs 10f and 11f.

The Low Level Amplifier also includes the discharge paths T1 and T2, each of which has an anode 71, 81, a cathode 73, 83 and a grid 75, 85. The input circuit of path T1 includes a grid resistor 91 connected to grid 75, a resistor 93 connecting the grid resistor 91 to ground and resistors 95 and 97. With arm 61 in different positions, resistors 91 and 93 may be connected in different networks to impress the signals apearing at plugs Phono Hi-Level, Phono Lo-Level, or Special across grid 75. With arm 61 set as shown in the drawing the impedance across Phono Hi-Level consists of a network in which 97 is in parallel with 95 and 93 (this produces a termination impedance of 50,000 ohms in the circuit specifically illustrated in the drawings). Also, the termination across Phono Lo-Level consists of a network in which 95 and 97 are in parallel with 93 (also 50,000 ohms). For Special, 61 is turned so that 5r and 11r are connected (SW in extreme clockwise setting) and in this case the termination impedance is 93 (56,000 ohms).

The anode 71 is connected to B supply pin H through a plurality of resistors 101, 103, 105, and anode resistor 107. The anode 81 is connected to pin H through resistors 101 and 103 and anode resistor 109. The B supply is by-passed to ground for each path by capacitors 111 and 113, respectively. The cathode 78 is connected to ground through cathode resistor 115.

The anode 71 is connected to the grid 85 through coupling condenser 117 which is connected to ground through a grid resistor 119. The cathode 83 is connected to ground through cathode resistor 121. A resistor 123 is connected between the cathodes 73 and 83 furnishing positive feedback. The resistors 115 and 121 being un-bypassed constitute negative feedback connections for the tubes T1 and T2. Through these connections degenerative signals dependent on the currents conducted by the tubes are impressed in the control circuits of tubes T1 and T2. In accordance with the specific aspects of this invention the resistors 115 and 121 have a magnitude of about one-hundredth of the anode resistor 107 and 109, respectively. This is roughly proportional to the amplification factor of the paths.

A negative feedback connection is provided between the anode 81 and the cathode 78. This includes a coupling capacitor 127 and an equalization network N1 which may be set for different inputs by arm 63. This network N1 includes a plurality of capacitors 129, 131, 133 and a plurality of resistors 135, 139 and 137 which may be selectively connected in series between the coupling capacitor 127 and the cathode 73. In addition a resistor 139 and a capacitor 141 shunt the selectively adjustable series network. The selectively adjustable part of the network N1 is also shunted by a high resistor 143.

The Tone Control Unit includes the paths of triodes T3 and T4. These triodes have anodes 151 and 161, cathodes 153 and 163 and control electrodes 155 and 165, respectively. The input to the Tone Control Unit is a variable resistor PV which serves as a volume control. This resistor PV is connected to ground at one terminal and its adjustable arm 167 is connected to the grid 155.

A loudness control network N2 controlled by a loudness control switch SL is connected to a point intermediate the ends of resistor PV. The network N2 includes a capacitor 169 and a resistor 171 connected across the portion of PV between a tap 173 and ground and another resistor 175 and another capacitor 177 adapted to be connected across the remaining portion of PV in the "on" position of switch SL (illustrated).

To supply anode voltage to the triodes T3 and T4 pin H is connected to the anode 151 through resistor 101 and an anode resistor 181 and to anode 161 through anode resistor 183. The B+ supply is by-passed to ground through capacitors 184 and 186. The cathodes 153 and 163 are connected to ground through cathode resistors 185 and 187, respectively. The anode 151 is connected to the grid 165 through a coupling capacitor 189 and the capacitor is connected to ground through a grid resistor 191. The cathode resistors 185 and 187 preferably have a magnitude of the order of one-hundredth of the anode resistors 181 and 183, respectively, and operate to produce negative feedback dependent on the current conducted by the triodes T3 and T4.

The voltage feedback connection includes a coupling capacitor 201, bass tone control network N3 and treble tone control network N4. The capacitor 201 couples the anode 161 to cathode 153 through the networks N3 and N4. The network N3 includes the variable resistor 203 which is shunted on each side of the arm 205 by the capacitors 207 and 209.

The network N3 may be regarded as having an attenuate section including capacitor 209 and the parallel resistors 211 and 213 on the right and a boost section including capacitor 207 and resistor 227 on the left. The boost section is connected to the cathode 153 through the coupling network including capacitor 215 and resistor 227. Output is derived from the stage T4 through the capacitor 201, the capacitor 209 and output coupling capacitor 231. It is desirable that resistors 211 and 213 and the input to the amplifier supplied shall have an equivalent resistance equal to the resistance 227. The variable resistor 203 may be a linear potentiometer.

The portion of the signal from the output of T4 impressed on the attenuate section passes through capacitor 209 and is shunted to ground through resistors 211 and 213 and thus reduces low frequency response. The portion of this signal impressed on the boost section is degeneratively connected to the cathode of T3 through 227 and 207 which increase low frequency response. The attenuate network (209, 211, 213) and the boost section (207, 227) have substantially the same time constant to assure flatness of response at the flat setting. The control 203 is large with respect to 227 and the combined 211 and 213 so as not to negate the effect of 207 and 209.

The treble network includes a boost section including the upper part of resistor 217 and capacitor 221 and an attenuate section including the capacitor 219 and the lower part of resistor 217. The portion of the signal from the output of T4 impressed on the boost section is shunted to ground through capacitor 221, while the portion of this signal impressed on the attenuate section is impressed degeneratively on the cathode. The time constants of the networks including capacitor 221 and resistor 185 and capacitor 219 and resistor 227 are approximately equal. Flatness of response at the flat setting of resistor 217 is obtained partly because of this equality and partly because resistor 217 is very high and isolates the effects of 221 and 219.

The network N4 includes the variable resistor 217 which is connected to ground through capacitor 221 and to the cathode 153 through capacitor 219 and resistor 227. The arm 223 of the resistor 217 is also connected to the cathode 153 through a resistor 225. The resistor 217 is preferably a reverse tapered potentiometer which includes 90% of the resistance at 50% rotation.

The bass section of the tone control networks increases bass by removing low frequency degeneration and decreases bass by use of a small output coupling capacitor, i.e., by introducing attenuation. With the two time constants equal, as determined by the mid position of contact 205, the response of the circuit will be flat, i.e., equal degeneration will exist from the anode of triode T4 to the cathode of triode T3.

The treble network N4 adds or removes degeneration, for cut and boost respectively. The flat position may be obtained by providing suitable adjustment of the time constants as seen by contact 223, or by use of a sufficiently large resistance potentiometer. In the present system the potentiometer has a value of 400,000 ohms and in addition the time constants are set for flat response, whereby the time constants are not critical.

It is known in the prior art to obtain treble control by increasing degeneration to obtain cut and removing it to obtain boost. However, it is not known to provide treble control feedback from anode of a second stage to cathode of a first stage, and this has the advantage that the feedback point is at low impedance.

A major advantage of the present system includes the signal level at which operation takes place. If, for example, A.C. assume two stages with stage gains of 10 db and a tone control insertion loss of 10 db we have a combined gain of 10 db with a potential boost of 10 db in the tone controls. The first stage operates at low level and with its own internal feedback, as well as with external feedback so that it does not introduce distortion, as would be the case for high level operation, or operation without internal feedback.

In the present invention, the treble boost circuit operates essentially independently of amplification, and the audio signal is not required to pass through an attenuating network, and therefore operates at low drive level, this decreasing distortion.

Use of the presently described tone control circuits has made feasible attainment of .05% 1M distortion for several volts of output.

It is of importance to note that the bass control circuit operates to decrease bass by introducing attenuation at the output section, while the feedback section covers boost, the two effects compensating at the flat or center position of the bass control potentiometer, when the treble control adds or removes degeneration for cut and boost, respectively.

The Audio Output plug is coupled to the anode 161 through capacitor 201, 209 and a coupling capacitor 231.

The output of the Low Level Amplifier is adapted to be connected to the input (resistor PV) of the Tone Control Unit through capacitor 127, a coupling capacitor 233, pins 5*f* and 2*f* and arm 65, and monitor switch SM in the monitor position of the switch. The output of the Low Level Amplifier is also adapted to be connected through capacitors 127 and 233 and 2*f* and 5*f* to Tape Out. Thus a tape recording may be monitored. In addition the Radio or TV plugs are adapted to be selectively connected to the input of the Tone Control through SM in the monitor position and through 10*f*, 5*f*, 65 or 11*f*, 5*f* and 65. When Radio and TV are not in use they are grounded through 10*f*, 11*f*, 65 and 67.

The Power Supply Unit includes the socket SO through which the anode potential is supplied. In addition this Unit includes a voltage doubler VD connected to pins F1 and F2 for supplying current to the heaters 51, 53, 55, 57. To suppress hum a filter network is provided which includes a variable resistor 235 and a pair of filter capacitors 237 and 239 connected between the junction of heaters 51 and 53 and the arm 241 of the resistor 235. The junction of the capacitors 237 and 239 is grounded. Hum is eliminated by properly centering the arm 241. For effective hum elimination the heaters 51, 53, 55, 57 should float electrically with reference to the corresponding cathodes 78, 83, 153, 163.

The bass and treble controls N3 and N4 are of the type in which the center setting of the arms 205 and 223 gives flat response without frequency discrimination. These increase or decrease the signal level at frequency extremes depending on whether they are rotated clockwise or counter-clockwise. Normal "flat" use of these controls is in the center position with variation made to correct the tonal balance to please the taste of the listener.

The volume control resistor PV also acts as an on-off switch, going "on" as soon as rotated from its most counter-clockwise position. The overall sensitivity and gain of the pre-amplifier as shown in the drawing is such that the volume control is in the center of its range when this invention is used with power amplifiers requiring from one to two volts for full output. Power amplifiers of greater sensitivity than this normally have means for adjusting their sensitivity by means of an input level control. In that case the amplifier's control should be set to give fairly loud level when the volume control of the pre-amplifier shown in the drawing is in its normal setting. Power amplifiers of lower sensitivity, requiring two volts or more for full output, cannot be driven to full output from this pre-amplifier with low level signal sources. For example, a magnetic cartridge like the Fairchild 215 has an average output of 3 millivolts. This signal level will produce 1.5 volts output from the pre-amplifier shown in the drawing. This is sufficient to drive a power amplifier to full output. Power amplifiers of less sensitivity will not give full output from this signal source. However, with a cartridge which furnishes 10 millivolts output, the pre-amplifier shown in the drawing will give up to 5 volts output. This is more than enough for any available power amplifier.

The "loudness" switch SL introduces loudness correction when the volume control is below its mid settings. This correction involves an increase in level of the bass below 400 c.p.s. and the treble above 3000 c.p.s. This correction is used because the ear is not as sensitive to extreme frequencies at low levels as at high levels. When music is played softly, it sounds thinner because of this effect as if the listener sat further away from the original sound source. Loudness compensation helps to move the listener back to the front of the concert hall. The switch SL permits introducing or eliminating the correction. When the loudness is "on," the corrective effect is diminished when the volume is increased and signal levels are louder, and vice versa. When the switch SL is "off," there is no frequency discrimination in the volume control circuit. The effect is restricted in the pre-amplifier, according to this invention, so that it can be used without obvious distortion of the tonal balance. This type of subtle correction does not add boom or muddy quality to the reproduction.

The following table describes concisely the facilities and the properties of a pre-amplifier having the components and the tube types specified in the drawing:

Inputs:
- Low level magnetic cartridge, high level magnetic cartridge, radio, TV, tape, special optional low level.

Outputs:
- Tape, audio output into power amplifier.

Controls:
- Selector and equalization, bass, treble, volume, tape monitor, loudness, and hum balance.

Tone control range:
- ±14 db at 20,000 c.p.s. ±20 db at 20 c.p.s.

Phono equalization:
- RIAA, 78 r.p.m., original LP.

Distortion:
- Less than .1% intermodulation at sufficient output to drive presently available power amplifiers. This low distortion maintained at any setting of volume control.

Frequency response:
±.5 db from 6 c.p.s. to 60 kc. if tone controls are accurately zeroed. Response is not affected by position of volume control.

Transient performance:
Passes square waves without deformation or ringing from 20 c.p.s. to 20 kc. at any volume control setting. There is no overshoot or bounce on pulse type signals. Instantaneous recovery from overload.

Noise:
Less than 3 microvolt equivalent noise input on RIAA. Less than 1.5 microvolt equivalent on connection. Between 70 and 74 db below level of 10 millivolt magnetic cartridge.

Gain:
54 db at 1000 c.p.s. on RIAA input. 20 db 20 c.p.s. to 20 kc. on high level inputs.

Impedances:
Output impedance 1000 ohms. Terminating impedance 500,000 ohms (provision for 250,000 ohms).

Tubes:
2 12AX7 (ECC–83), 1 selenium stack.

Power requirements:
200 to 400 volts D.C. at 3 to 4 ma., 6 volts A.C. at .75 amps.

Circuit values employed in one exemplary embodiment of the tone control section of the system are as follows:

| | |
|---|---|
| **185** | 4700Ω |
| **187** | 1000Ω |
| **203** | 750K |
| **207, 209** | .0075 μf. |
| **211** | 510K |
| **213** | 62K |
| **215** | 33 μμf. |
| **225** | 1K |
| **217** | 400K |
| **221** | .02 μf. |
| **219** | .002 μf. |
| **227** | 47K |

Figure 4:
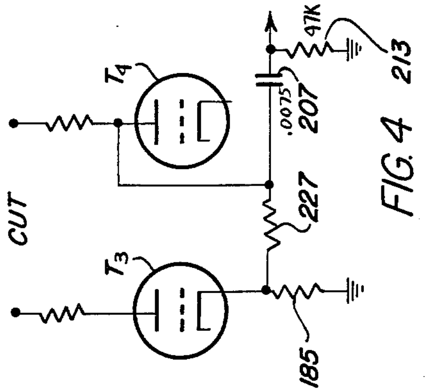
FIGURE 4 is a diagram of the effective circuit of FIGURE 2 when in full cut condition.
Figure 3:
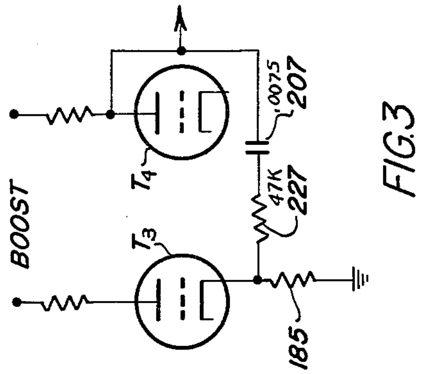
FIGURE 3 is a diagram of the effective circuit of FIGURE 2 when in full boost condition.
Figures 5, 6, 7:
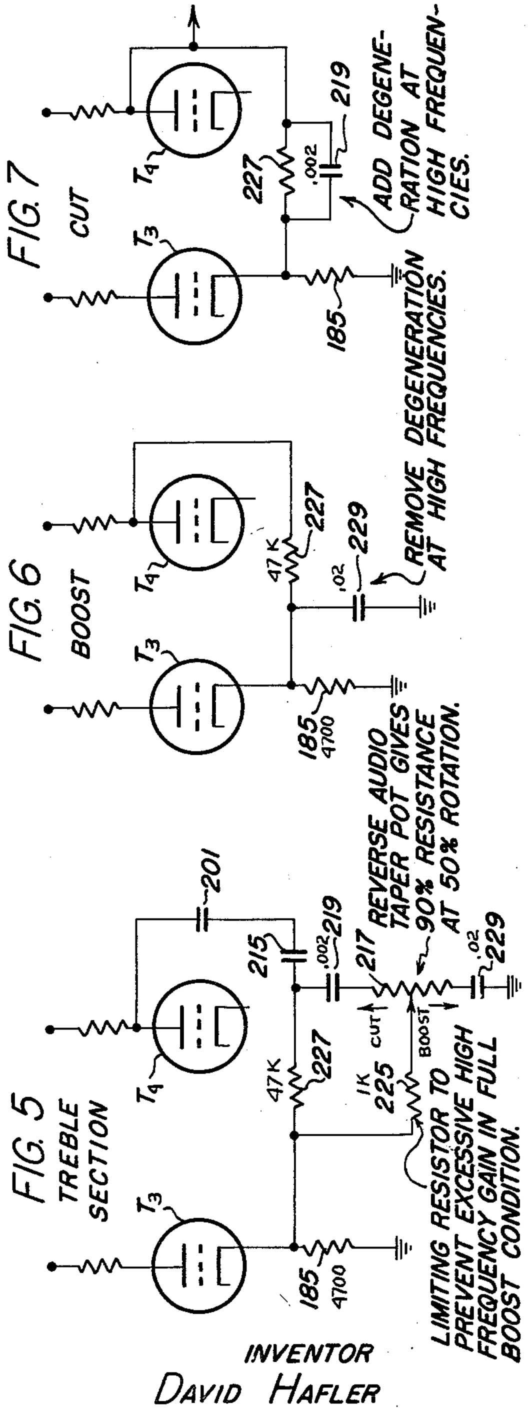
FIGURE 5 is a circuit diagram of the treble control section of the system of FIGURE 1.
FIGURE 6 is a diagram of the effective circuit of FIGURE 4 when in full boost condition.
FIGURE 7 is a diagram of the effective circuit of FIGURE 5 when in full cut condition.

The operation of the bass section of the tone control circuits of the present invention, may best be explained by reference to FIGURES 2–4, inclusive, of the accompanying drawings, which illustrates the bass section of the tone control (FIGURE 2) and its effective form under full boost condition (FIGURE 3) and full cut condition (FIGURE 4). The treble control circuit is illustrated in FIGURE 5, FIGURE 6 illustrating the effective form of FIGURE 5 for full boost and FIGURE 7 for full cut.

Figure 2:
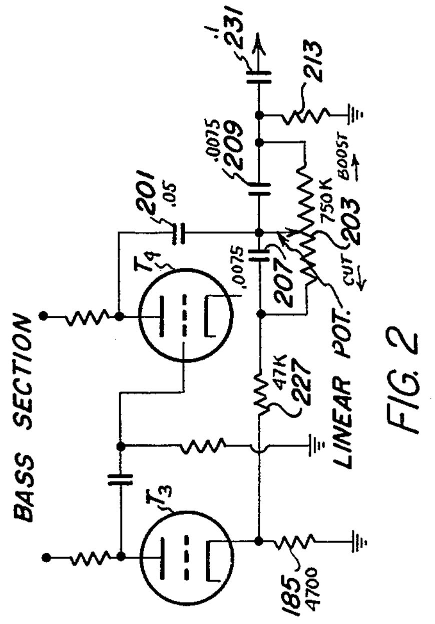
FIGURE 2 is a circuit diagram of the bass control section of the system of FIGURE 1.

Referring to FIGURE 2, the bass section includes a control circuit a section of which extends from the anode of tube T4 to the cathode of tube T3, and a further section of which is in series with an output lead and which acts as an attenuator.

With the slider of linear potentiometer 203 in full boost position the attenuating section is eliminated, and condenser 207 is in the feedback loop, in series with resistance 227 and cathode resistance 185. In the full cut condition, on the other hand, the slider of potentiometer 203 is connected directly to resistance 227, while condenser 209 is connected in series with the output lead. For this condition maximum attenuation exists in the output circuit, coupled with maximum feedback. Accordingly, the bass tone control section increases bass by reducing low frequency degeneration and decreases bass by increasing attenuation in the output circuit.

In the flat condition of the bass control, the slider of potentiometer 203 is in mid-position, wherein the two halves of the tone control circuit have equal time constants, and the feedback and attenuation are complementary. Boost occurs by decreasing degeneration and attenuation, and cut occurs in response to increase of degeneration and increase of attenuation.

The treble section of the tone control operates solely as a feedback network, adding degeneration for cut and removing degeneration for boost.

For full boost condition, referring to FIGURE 6, the feedback circuit is a series circuit, the condenser 229 being in shunt to cathode resistance 185, and reducing high frequencies supplied thereto from the anode of tube T4. For full cut condition (FIGURE 7) the RC feedback circuit is parallel, so that degeneration increases as a function of frequency, i.e., condenser 219 supplies more feedback signal across cathode resistance 185, as frequency increases.

For flat condition, the two opposing feedback effects compensate each other, or if they fail to do so the potentiometer 217 is made sufficiently large (400 K) that the time constants of the two feedback circuits are not critical.

While I have described and illustrated one specific embodiment of my invention, it will be clear that variations of the details of construction which are specifically illustrated and described may be resorted to without departing from the true spirit and scope of the invention as defined in the appended claims.

What I claim is:

1. A pre-amplifier comprising a low-level amplifier including a first discharge path having at least an anode, a cathode and a grid, a second discharge path having at least an anode, a cathode and a grid, a ground connection, means connecting said first and second paths in a fast cascade amplifier circuit with an input between the grid of said first path and said ground connection and an output at said anode of said second path, said first amplifier circuit also including a current feedback connection between the cathode of each path and said ground connection and a voltage feedback connection between said anode of said second path and said cathode of said first path, means connecting a variable resistor having an adjustable arm between said anode of said second path and ground, a control unit including a third discharge path having at least an anode, a cathode and a grid, a fourth discharge path having at least an anode, a cathode and a grid means connecting said third and fourth paths in a second cascade amplifier circuit having an input between said grid of said third path and said ground connection and an output between said anode of said fourth path and said ground connection, said second amplifier circuit also including a current feedback connection between the cathode of each path and said ground connection and a voltage feedback connection between said anode of said fourth path and said cathode of said third path, said last-named feedback connection including tone control means, and means connecting said arm to said grid of said third path.

2. A pre-amplifier comprising a low-level amplifier including a first discharge path having at least an anode, a cathode and a grid, a second discharge path having at least an anode, a cathode and a grid, a ground connection, means connecting said first and second paths in a fast cascade amplifier circuit with an input between the grid of said first path and said ground connection and an output at said anode of said second path, said first amplifier circuit also including a current feedback connection between the cathode of each path and said ground connection and a voltage feedback connection between said anode of said second path and said cathode of said first path, a control unit including a third discharge path having at least an anode, a cathode and a grid, a fourth discharge path having at least an anode, a cathode and a grid means connecting said third and fourth paths in a second cascade amplifier circuit having an input between said grid of said third path and said ground connection and an output between said anode of said fourth path and said ground connection, said second amplifier circuit also including a current feedback connection between the cathode of each path and said ground connection and a voltage feedback connection between said anode of said fourth path and said cathode of said third path, said last-named feedback connection including tone-control means, and volume control means connecting said anode of said second path and said input of said third path.

3. An amplifier including a high signal level input terminal, a low signal level input terminal, a low-level amplifier having first input and first output connections and first negative feedback connections, said first input connection being coupled to the signal applied to the low level input terminal, a control amplifier having second input and second output connections and second negative feedback connections, said second input connections including volume control means and said second feedback connections including tone control means, first means connected to said first input connections and to said first output connections for impressing low-level signals on said first input connections and with said low level signals impressed for connecting said first output connections to said second input connections so that said control amplifier amplifies the output of said low-level amplifier, and manual means for disconnecting the first output connections to said second input connections while coupling the signal applied to the high level input terminal to said second input connections, said last named means including means for decoupling the high level terminal from the second input connections when said first output connections are connected to said second input connections.

4. The combination of claim 3 further including means for grounding said high level terminal when said first output connections are connected to said second input connections.

5. A tone control circuit comprising a first amplifier tube having a first cathode, a first anode, and a first signal input grid, a second amplifier tube having a second cathode, a second anode and a second signal input grid, means coupling said first anode to said second signal input grid for audio signal input grid for audio signal frequencies, and tone control means coupling said second anode to said first cathode, said tone control means including unbypassed resistance connected between said first cathode and a point of reference potential, said tone control means further including a potentiometer having two end terminals and a slider, a capacitor connected between said second anode and said slider, a first condenser connected between said slider and one of said end terminals, a second condenser connected between said slider and the other of said end terminals, a signal output terminal connected to said other of said end terminals, and a resistive connection between said first cathode and said one of said end terminals, said first and second condensers being approximately equal.

6. The circuit of claim 5 further including a second tone control means coupling said first anode to said second cathode, said second tone control means including an unbypassed feedback resistance connected between said first cathode and ground, said second tone control means including a potentiometer having two end terminals and a slider, a limiting resistor connected between said first cathode and said slider, a first condenser connected to one of said end terminals, a second condenser connected to the other of said end terminals, a feedback resistance connected at one end to said first cathode, capacitive means coupling the other end of said feedback resistance to said second anode, means for connecting said second capacitor to ground, means for connecting said first capacitor to the point where said feedback resistor and said capacitive means are of equal potential, said first and second condenser and said potentiometer providing a series tone control circuit, and means connecting said series tone control circuit between (1) the junction of said feedback resistance and said capacitive means and (2) ground.

7. An audio tone control circuit comprising a first amplifier having a first common electrode, a first signal input electrode and a first output electrode, a second amplifier having a second common electrode, a second audio signal input electrode and a second output electrode, an audio frequency coupling circuit connected between said first output electrode and said second signal input electrode, a resistance unbypassed for said audio signal connected between said first common electrode and ground, a feedback circuit connected between said second output electrode and said first common electrode, said feedback circuit including said unbypassed resistance and further including at least one tone variational circuit, said at least one tone variational circuit having a pair of approximately equal capacitors and a resistance connected in series with one terminal of each of said capacitors, and means for variably at will tapping from any selected point of resistance to said first common electrode, said resistance having a mid-point balanced with respect to the said equal capacitors, means for coupling the other terminals of the capacitors and the tapping means together, means for coupling the signal at the second output electrode to the tapping means and an audio signal output circuit connected to a point of said last mentioned circuit.

8. The combination according to claim 7 wherein is provided a signal output terminal and wherein said at least one tone variational circuit is connected only between said first common electrode and said output terminal.

9. The combination according to claim 8 wherein said tone variational circuit is coupled between said second anode and ground.

References Cited in the file of this patent

UNITED STATES PATENTS

| | | |
|---|---|---|
| 2,264,715 | Rohr | Dec. 2, 1941 |
| 2,281,238 | Greenwood | Apr. 28, 1942 |
| 2,282,870 | Lundie | May 12, 1942 |
| 2,323,634 | Van Slooten | July 6, 1943 |
| 2,514,267 | Watkinson | July 4, 1950 |
| 2,553,673 | Purington | May 22, 1951 |
| 2,589,723 | Miller | Mar. 18, 1952 |
| 2,679,553 | Ruiz | May 25, 1954 |
| 2,695,337 | Burwen | Nov. 23, 1954 |
| 2,752,432 | Richter | June 25, 1956 |
| 2,775,656 | Hounsfield | Dec. 25, 1956 |
| 2,994,040 | Waldhauer | July 25, 1961 |

FOREIGN PATENTS

| | | |
|---|---|---|
| 1,077,456 | France | Apr. 28, 1954 |